(12) United States Patent
Ni et al.

(10) Patent No.: US 6,888,197 B2
(45) Date of Patent: May 3, 2005

(54) POWER METAL OXIDE SEMICONDUCTOR FIELD EFFECT TRANSISTOR LAYOUT

(75) Inventors: Cheng-Tsung Ni, Hsinchu (TW); Jen-Te Chen, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 124 days.

(21) Appl. No.: 10/668,434

(22) Filed: Sep. 22, 2003

(65) Prior Publication Data

US 2004/0113205 A1 Jun. 17, 2004

(30) Foreign Application Priority Data

Nov. 7, 2002 (TW) .................................. 91132834 A (51) Int. Cl.⁷ .................. H01L 31/119; H01L 31/113; H01L 31/062; H01L 29/94; H01L 29/76
(52) U.S. Cl. .................. 257/341; 257/342; 257/288; 257/327; 257/335
(58) Field of Search .................. 257/341, 342, 257/288, 327, 335

(56) References Cited

U.S. PATENT DOCUMENTS

| | | | |
|---|---|---|---|
| 5,136,349 A | * 8/1992 | Yilmaz et al. | 257/339 |
| 5,895,951 A | 4/1999 | So et al. | |
| 6,005,271 A | 12/1999 | Hshieh | |
| 6,344,379 B1 | * 2/2002 | Venkatraman et al. | 438/192 |
| 6,365,947 B1 | * 4/2002 | Vollrath et al. | 257/401 |
| 6,404,023 B1 | * 6/2002 | Mori et al. | 257/393 |
| 6,828,637 B2 | * 12/2004 | Kim et al. | 257/390 |
| 2004/0207011 A1 | * 10/2004 | Hiroshi et al. | 257/341 |

* cited by examiner

*Primary Examiner*—Nathan J. Flynn
*Assistant Examiner*—Victor A. Mandala, Jr.
(74) *Attorney, Agent, or Firm*—Townsend and Townsend and Crew LLP (57) ABSTRACT

A power MOSFET layout according to one embodiment of the invention comprises a substrate and a plurality of cells. Each of the cells includes a base portion, a plurality of protruding portions extending from the base portion, and a plurality of photo-resist regions. Each of the cells is geometrically configured with the base portion and the plurality of protruding portions defining a closed cell boundary enclosing each of said cells. The cells are formed over the substrate, and the closed cell boundaries of the cells are arranged regularly with each other with no overlapping among the cells. The base portions are disposed in a matrix arrangement having rows and columns. The base portions are oriented from end to end in a direction of the columns and the protruding portions extend from the base portions along a direction of the rows. The photo-resist regions cover the base portions on the same column. None of the protruding portions are disposed between the base portions on the same column. The cells are doped with N type dopants by using the photo-resist regions as masks.

25 Claims, 12 Drawing Sheets

POWER METAL OXIDE SEMICONDUCTOR FIELD EFFECT TRANSISTOR LAYOUT

CROSS-REFERENCES TO RELATED APPLICATIONS

This application claims priority from R.O.C. Patent Application No. 091132834, filed Nov. 7, 2002, the entire disclosure of which is incorporated herein by reference.

BACKGROUND OF THE INVENTION

The invention is related to a power MOSFET (metal oxide semiconductor field effect transistor) layout, and more particularly to a power MOSFET layout with protruding portions.

Figure 1:
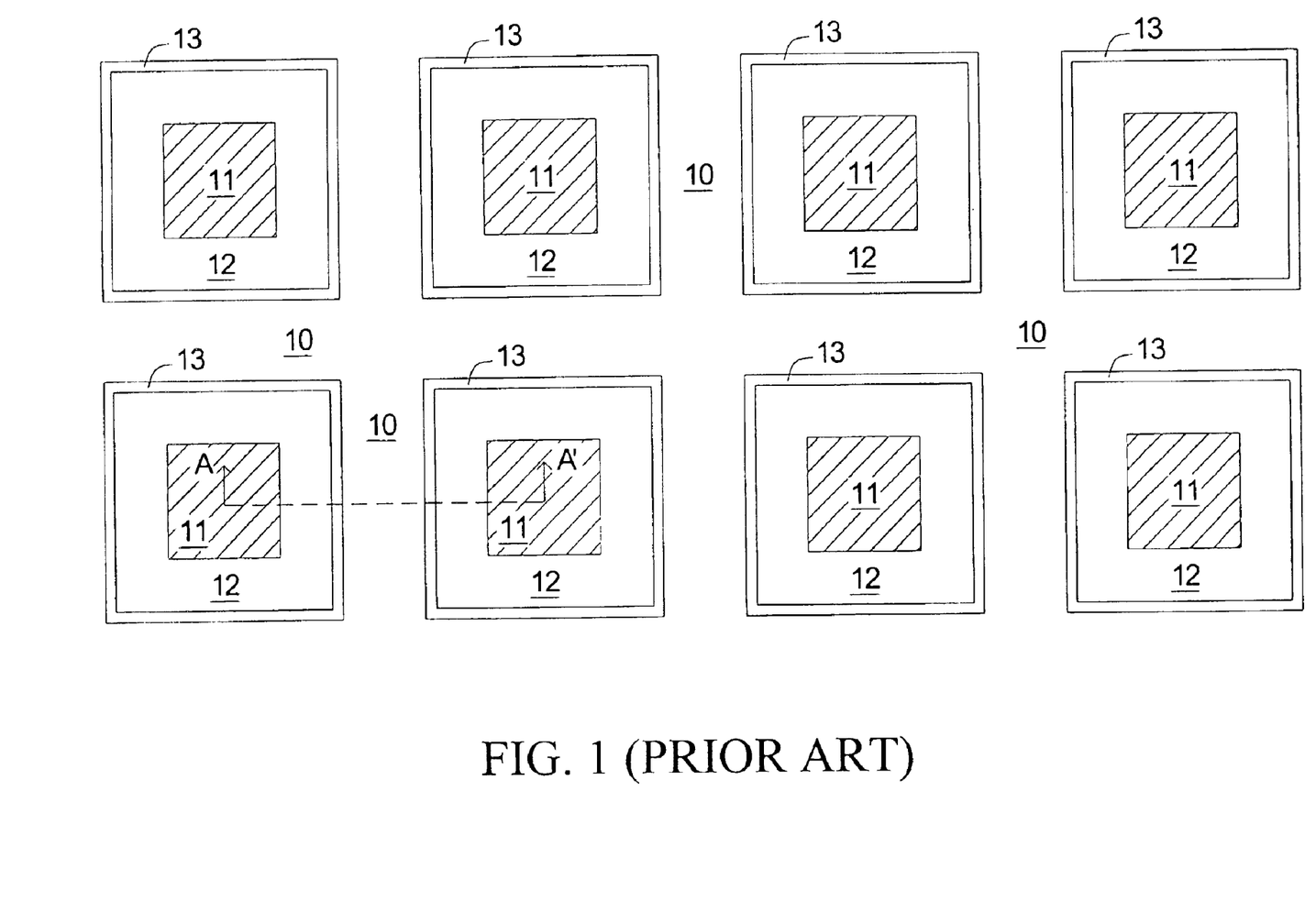
FIG. 1 illustrates a conventional layout for a power MOSFET.
Figure 2:
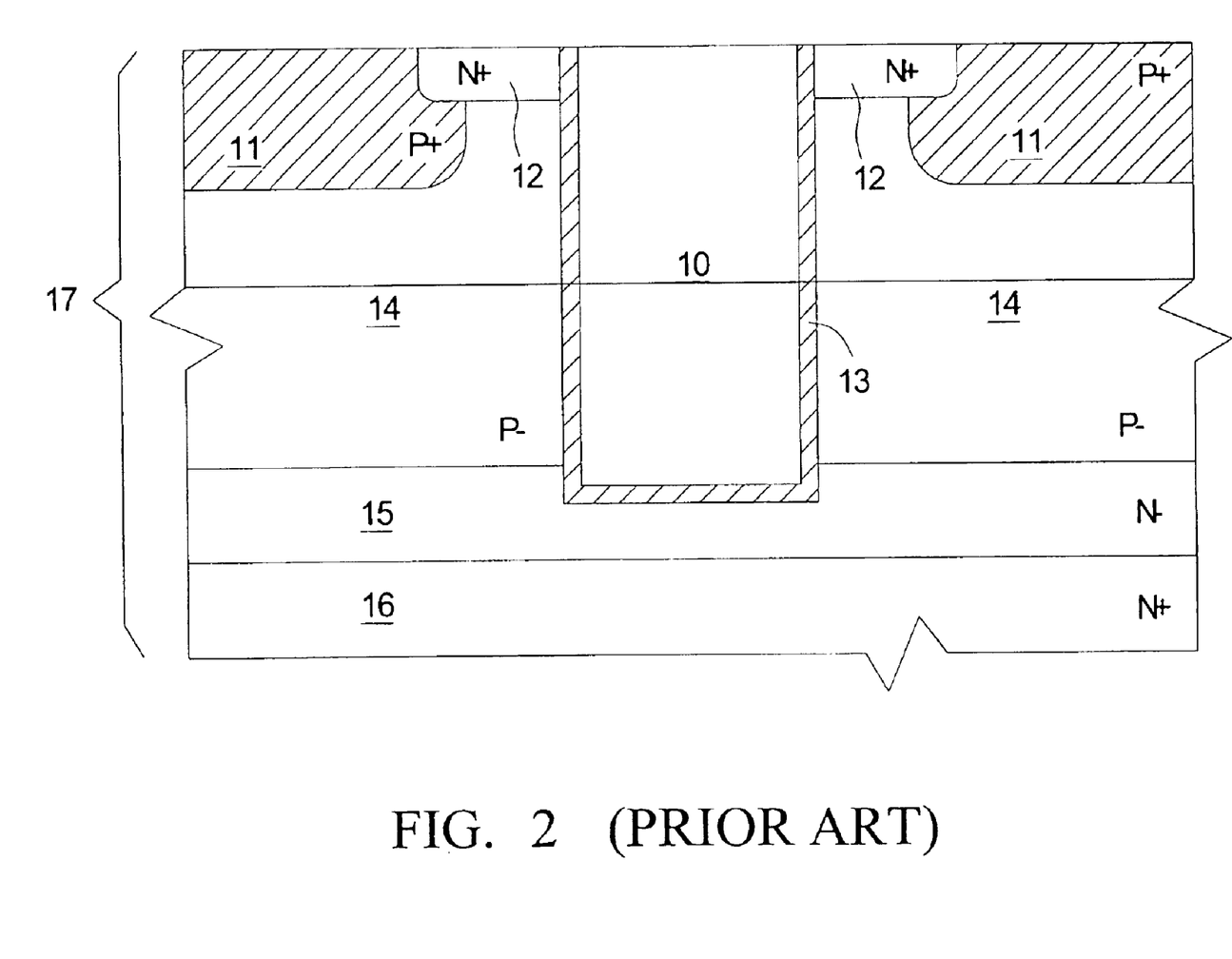
FIG. 2 illustrates the cross-sectional view taken along line A–A' of FIG. 1.

FIG. 1 illustrates the conventional layout for a power MOSFET. The power MOSFET is a trenched field effect transistor and has a plurality of cells. Each cell has a cell body contact region 11, a source region 12, and an insulation layer 13, surrounded by a trenched gate 10. FIG. 2 illustrates the cross-sectional view taken along line A–A' of FIG. 1. The power MOSFET is formed in the substrate 17. The trenched gate 10 is composed of conductive material isolated from the substrate by a coat of insulation 13. For example, the N type power MOSFET includes a source region 12 formed of N type material, a body 14 formed of P type material, an epitaxial layer 15 formed of lightly doped N type material (N−), and a drain contact layer 16 formed of heavily doped N type material (N+).

The manufacturing of the power MOSFET is first to form the trench by the photolithography etching process, and then to form the insulation layer 13 and the gate electrode 10 in turn. Then, p type dopants are implanted to form the P-body 14. A photo-resist profile is then formed on the substrate 17. The photo-resist profile covers the region 11. Then N type dopants are implanted to form the source region 12. After that the cell body contact region 11 is formed.

However, the photo-resist profile covering the cell body contact region 11 has a plurality of independent islands, which may peel off during the manufacturing process. Accordingly the manufacturing is difficult to perform, and small scale process technology is also difficult to achieve.

BRIEF SUMMARY OF THE INVENTION

Embodiments of the present invention are directed to a power MOSFET layout configured for easy manufacturing, especially for small scale process technology. The power MOSFET layout includes a plurality of cells arranged in a matrix having rows and columns. Each cell includes a base portion and a plurality of protruding portions. The base portion is a cell body contact region, and the protruding portions are source regions. The cell may include other cell body contact regions. The cell body contact regions are arranged along the columns with no source regions disposed on the columns. The photo-resist regions can extend along the columns of cell body contact regions without covering the source regions. This increases the coverage of the photo-resist regions over the conventional layout having relatively small, discrete cell body contact regions, and thus the possibility of photo-resist peel-off is reduced.

In one embodiment, a power MOSFET layout comprises a substrate and a plurality of cells. Each of the cells includes a base portion, a plurality of protruding portions extending from the base portion, and a plurality of photo-resist regions. Each of the cells is geometrically configured with the base portion and the plurality of protruding portions defining a closed cell boundary enclosing each of said cells. The cells are formed over the substrate, and the closed cell boundaries of the cells are arranged regularly with each other with no overlapping among the cells. The base portions are disposed in a matrix arrangement having rows and columns. The base portions are oriented from end to end in a direction of the columns and the protruding portions extend from the base portions along a direction of the rows. The photo-resist regions cover the base portions on the same column. None of the protruding portions are disposed between the base portions on the same column. The cells are doped with N type dopants by using the photo-resist regions as masks.

In another embodiment, a power MOSFET layout comprises a substrate and a plurality of cells. Each of the cells includes a base portion and a plurality of protruding portions extending from the base portion. Each of the cells is geometrically configured with the base portion and the plurality of protruding portions defining a closed cell boundary enclosing each of said cells. The cells are formed over the substrate, and the closed cell boundaries of the cells being geometrically arranged so that one cell does not overlay another cell on the substrate. The base portions are disposed in a matrix arrangement having rows and columns. The base portions are oriented from end to end in a direction of the columns and the protruding portions extend from the base portions along a direction of the rows. The base portions on the same column are configured to be covered by a photo-resist region. None of the protruding portions are disposed between the base portions on the same column. The cells are processed by using the photo-resist regions as masks.

DETAILED DESCRIPTION OF THE INVENTION

Embodiments of the present invention are directed to a power MOSFET which includes a substrate and a plurality of MOSFET cells. Each MOSFET cell is geometrically configured with a base portion of a longitudinal shape and at least one protruding portion extending from the sides of the base portion, such that the base portion and the protruding portions define a closed cell boundary enclosing the MOSFET cells. MOSFET cells are formed in the substrate, and all closed cell boundaries are arranged regularly with each other, i.e., with no overlapping among the cells. In specific embodiments, the protruding portions of each cell are proximally extended into the space separated by the protruding portions of other adjacent cells.

Figure 3A:
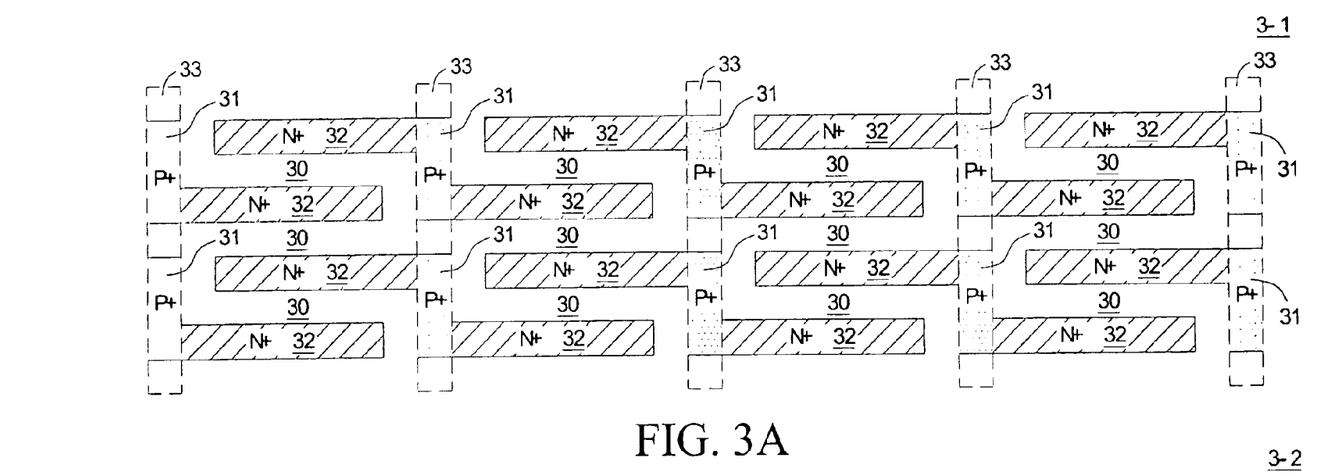
FIG. 3A is a Z type layout 3-1 of a power MOSFET according to an embodiment of the invention.

FIG. 3A is a Z type layout 3-1 of a power MOSFET according to an embodiment of the invention. Power MOSFETs include a substrate and a plurality of MOSFET cells. Each MOSFET cell has a base portion of a longitudinal shape, which is the cell body contact region 31, and two protruding portions, which are the source regions 32. The protruding portions extend from the sides of the base portion, and are located at opposite ends of the base portion. The power MOSFETs further include trenched gates 30, an insulation layer for insulating the gates 30, and the substrate.

In the process of forming gates 30, the cell body contact regions 31, and the source regions 32, the gates 30 are formed first. Then a first photo-resist profile is formed on the substrate. Therefore, the region of the substrate not covered by the photo-resist is doped with P type dopants. Then a second photo-resist profile is formed on the substrate, and the region covered by the second photo-resist profile is the photo-resist region shown as dashed lines. The photo-resist region includes a plurality of belt-like photo-resist regions 33. The regions not covered by the second photo-resist are doped with N type dopants. Then the cell body contact regions 31 and the source region 32 are formed. Each of the belt-like photo-resist regions 33 covers the cell body contact regions 31 of the same column. The covered area of each of the photo-resist regions is larger than that of the conventional layout, and thus the possibility of photo-resist peel-off is reduced.

The present invention is of a protruding type layout. The invention can use belt-like photo-resist regions to cover a plurality of cell body contact regions 31 during the formation of the photo-resist profiles. Particularly, there is no protruding portion between the base portions covered by belt-like photo-resist regions 33. The base portions are cell body contact regions 31. Thus, the photo-resist-covered area is enlarged through the belt-like photo-resist regions 33.

There are several variant types of layout according to different embodiments of the invention, which will be described in detail in the following paragraphs.

Figure 3B:
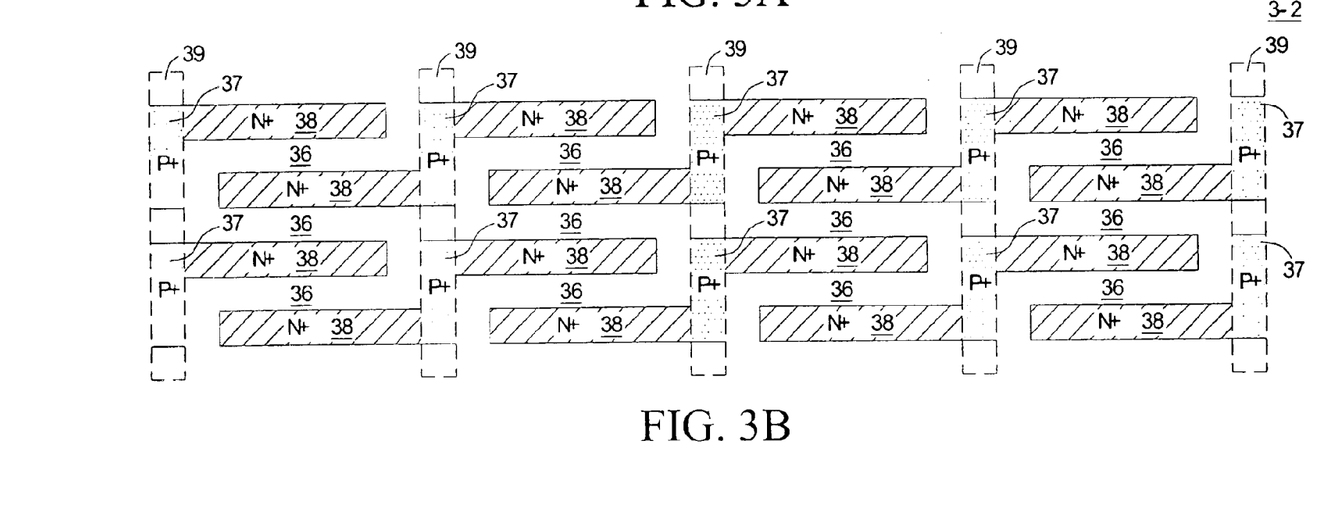
FIG. 3B is an S type layout 3-2 of a power MOSFET according to another embodiment of the invention.

FIG. 3B is an S type layout 3-2 of a power MOSFET according to an embodiment of the invention. The difference between the S type layout 3-2 and the Z type layout 3-1 is that, for layout 3-2, the relative positions of the base portion and protruding portions are different. The layout 3-2 uses belt like photo-resist regions to cover the cell body contact regions of the same column, for increasing the covered area and reducing the possibility of photo-resist peel-off. Power MOSFETs include a substrate and many MOSFET cells. Each MOSFET cell includes the base portion of a longitudinal shape, which is the cell body contact region 37, and two protruding portions, which are source regions 38, extending from the sides of the base portion. Further, the power MOSFETs include trenched gates 36, an insulation layer isolating the gates 36, and the substrate.

The photo-resist profile for forming the source regions 38 includes the belt like photo-resist region 39, which is indicated in dashed lines. The possibility of the photo-resist peel-off is reduced because each of the photo-resist regions covering the base portions of the same column increases the photo-resist profile covered area.

Figure 4A:
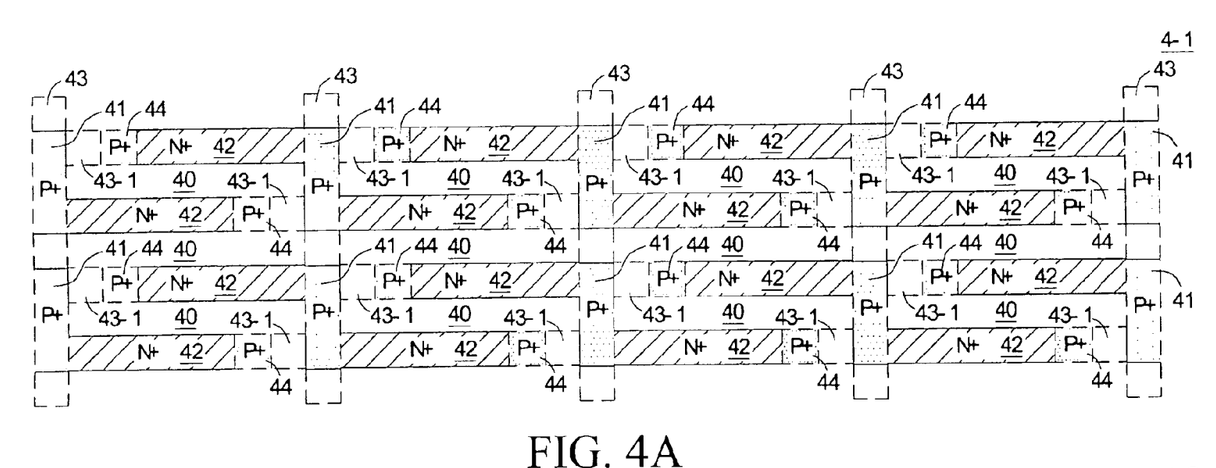
FIG. 4A is the second Z type layout 4-1 of a power MOSFET according to invention.

FIG. 4A, is a Z type layout 4-1 of a power MOSFET according to the invention. The difference between layout 4-1 and layout 3-1 (in FIG. 3A) is that, for layout 4-1, the end part of protruding portions of the layout 4-1 further includes an end portion, that is, a cell body contact region 44, for better grounding. Power MOSFETs include a substrate and a plurality of MOSFET cells. Each MOSFET cell includes a base portion of a longitudinal shape, which is the cell body contact regions 41, and two protruding portions extending through the sides of the base portion. One end of the protruding portion connecting to the base portion is a source region 42, and the other end is the end portion, that is, the cell body contact region 44. Further, the power MOSFETs include trenched gates 40, an insulation layer isolating the gates 40, and the substrate.

Each photo-resist region 43, which is illustrated in dashed line, having a photo-resist profile for forming the source region and the cell body contact region, further comprises a plurality of protruding portions 43-1. The protruding portion covers each end portion, extending to the sides from a belt-like photo-resist region located at the base portion. This produces a configuration in which the belt-like photo-resist region covers a plurality of the cell body contact regions of the same column and protruding portions at the same time. The possibility of photo-resist peel-off is reduced because the covered area of each photo-resist region 43 is larger than that in the conventional layout.

Figure 4B:
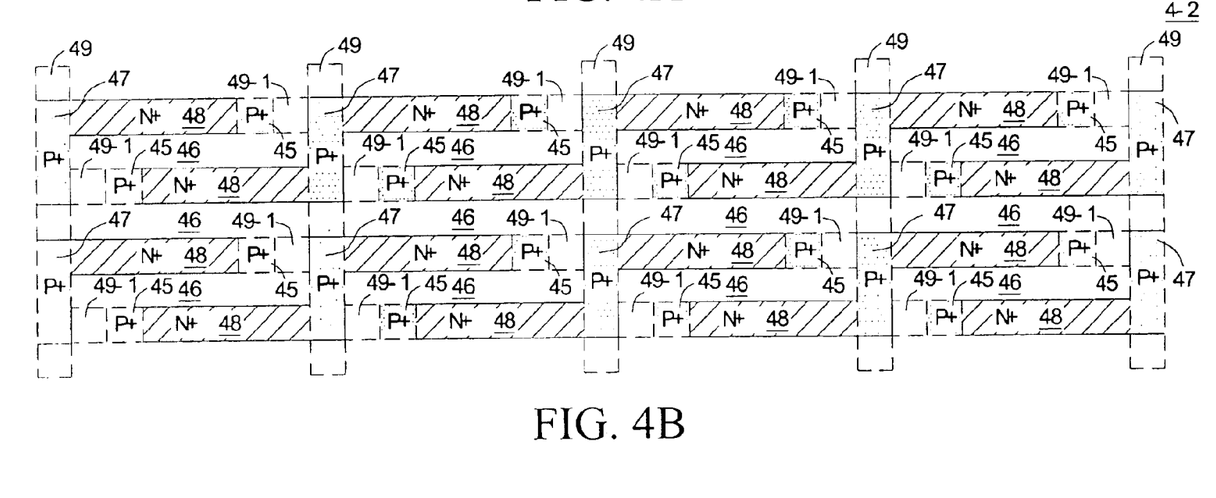
FIG. 4B is the second S type layout 4-2 of a power MOSFET according to another embodiment of the invention.

FIG. 4B is an S type layout 4-2 of a power MOSFET according to an embodiment of the invention. The difference between layout 4-2 and layout 3-2 (in FIG. 3B) is that, for layout 4-2, the end part of a protruding portion further comprises a cell body contact region. Power MOSFETs include a substrate and a plurality of MOSFET cells. Each MOSFET cell includes a base portion of a longitudinal shape, which is a cell body contact region 47, and two protruding portions extending from the sides of the base portion. One end of each protruding portion connecting to the base portion is a source region 48, and the other end is a end portion, which is a cell body contact region 45. Further, the power MOSFETs include trenched gates 46, an insulation layer isolating the gates 46, and the substrate.

Each photo-resist region 49, which is illustrated in dashed line, having a photo-resist profile for forming the source region 48 and the cell body contact regions 45,47, further comprises a plurality of protruding portions 49-1. The protruding portion covers each end portion, extending to the sides from the belt-like photo-resist region located at the base portion. This produces a configuration in which the belt-like photo-resist region covers a plurality of the cell body contact regions of the same column and protruding portions at the same time. The covered area of the photo-resist region 49 is relatively large and thus the possibility of photo-resist peel-off is reduced.

Figure 5A:
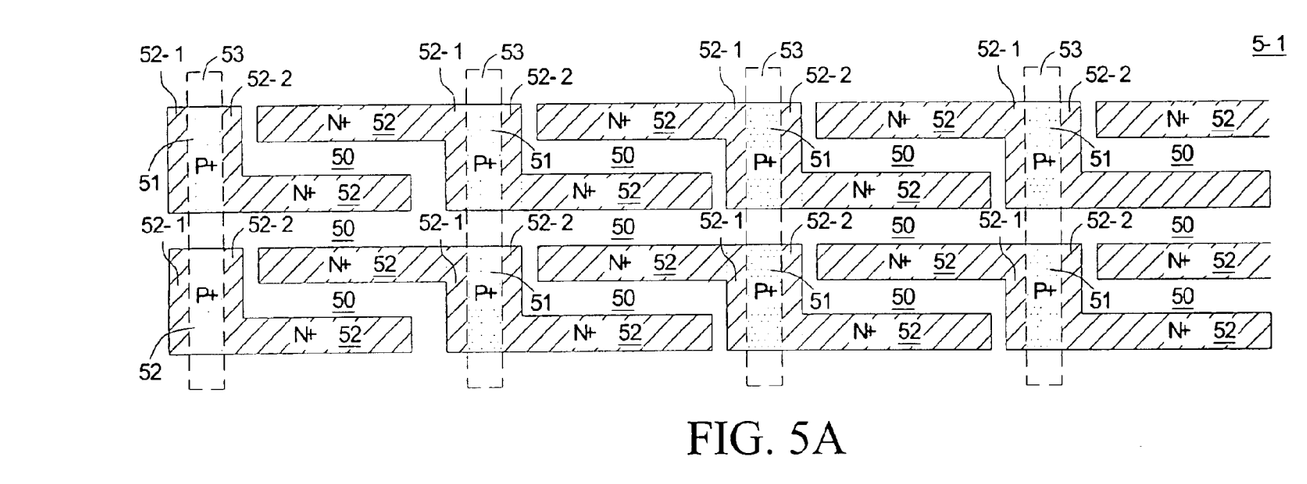
FIG. 5A is the third Z type layout 5-1 of a power MOSFET according to another embodiment of the invention.

FIG. 5A is a Z type layout 5-1 of a power MOSFET according to an embodiment of the invention. The difference between layout 5-1 and layout 3-1 (in FIG. 3A) is that, for layout 5-1, each base portion is wider for increasing the periphery length of source regions. Power MOSFETs include a substrate and a plurality of MOSFET cells. Each MOSFET cell includes a base portion of a longitudinal shape and two protruding portions. The base portion is divided into three belt-like zones, which are a first side zone, source region 52-1, a second side zone, source region 52-2, and a third middle zone, a cell body contact region 51. The protruding portions, which are the source region 52, extend from the sides of the base portion. Further, the power MOSFETs include trenched gates 50, the substrate, and an insulation layer isolating the gates 50.

The power MOSFET of layout 5-1 features a wider base portion than layout 3-1 does, so the periphery length for this power MOSFET's source regions is longer. One way to judge the layout quality is to reference the parameter PD, wherein PD=W/D, W is the periphery length of the cell's source electrode, and D equals to the cell area. When parameter PD is larger, it implies the power MOSFET has better properties. Therefore, the power MOSFET layout 5-1 is of better quality compared to layout 3-1. Each belt-like photo-resistant region 53, indicated by the dashed line, covers the cell body contact regions on the third middle zone 51 of the same column for reducing the possibility of photo-resist peel-off.

Figure 5B:
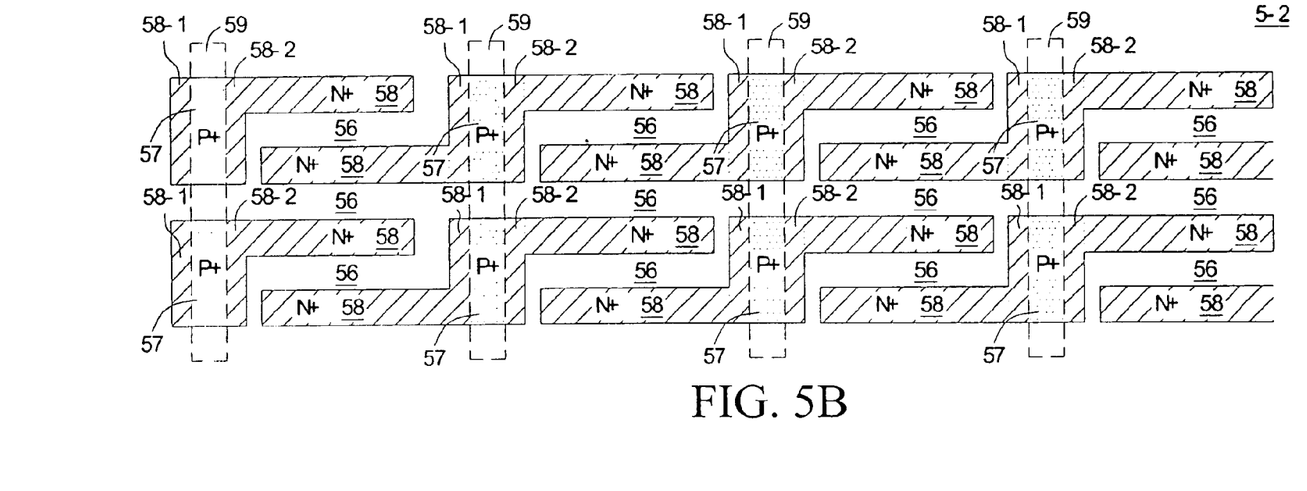
FIG. 5B is the third S type layout 5-2 of a power MOSFET according to another embodiment of the invention.

FIG. 5B is an S type layout 5-2 of a power MOSFET according to an embodiment of this invention. The difference between layout 5-2 and layout 3-2 (in FIG. 3B) is that, for layout 5-2, the base portion of layout 5-2 is wider than those of layout 3-2 in order to increase the periphery length of the source regions. Power MOSFETs include a substrate and a plurality of MOSFET cells. Each of the MOSFET cells includes a base portion of a longitudinal shape and two protruding portions. The base portion is divided into three belt-like zones, which are a first side zone, source region 58-1, a second side zone 58-2, and a third middle zone, a cell body contact region 57. The protruding portions, which are source regions 58, extend from the sides of the base portion. Further, the power MOSFETs include trenched gates 56, the substrate, and an insulation layer isolating the gates 56.

The parameter PD of power MOSFET layout 5-2 is larger than that of layout 3-2. The possibility of photo-resist peel-off is reduced because each belt-like photo-resist region 59, indicated by the dashed line, at the same time covers the cell body contact regions on the third middle region 57 of the same column. Therefore, a goal of the present invention is reached.

Figure 6A:
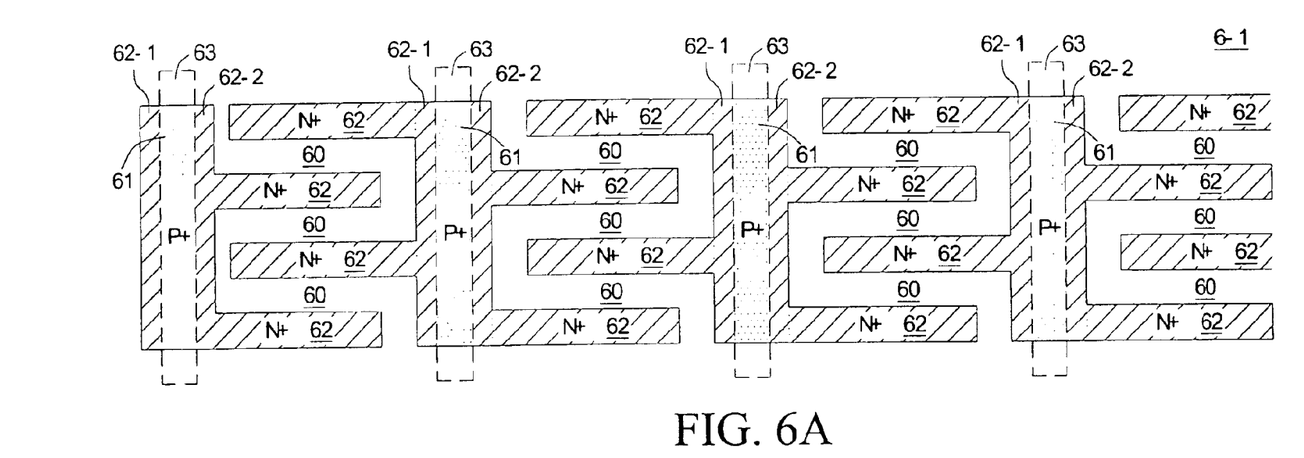
FIG. 6A is a multi-protruding-portion layout 6-1 of a power MOSFET according to another embodiment of the invention.

FIG. 6A is a multi-protruding-portion layout 6-1 of a power MOSFET. The layout 6-1 is composed of two MOSFET cells of layout 5-1. The periphery length of each source region is increased, and the parameter PD is also increased. Power MOSFETs include a substrate and a plurality of MOSFET cells. Each of the MOSFET cells includes a base portion of a longitudinal shape and four protruding portions. The base portion is divided into three belt-like zones, which are a first zone, source regions 62-1, a second zone 62-2, and a third middle zone, a cell body contact region 61. The protruding portions extend from the sides of the base portion to be the source region 62. Further, the power MOSFETs of layout 6-1 include trenched gates 60, the substrate, and an insulation layer isolating the gates 60. The belt-like photo-resist region 63, indicated by the dashed line, covers larger area than that shown in the prior art so as to reduce the possibility of photo-resist peel-off.

Figure 6B:
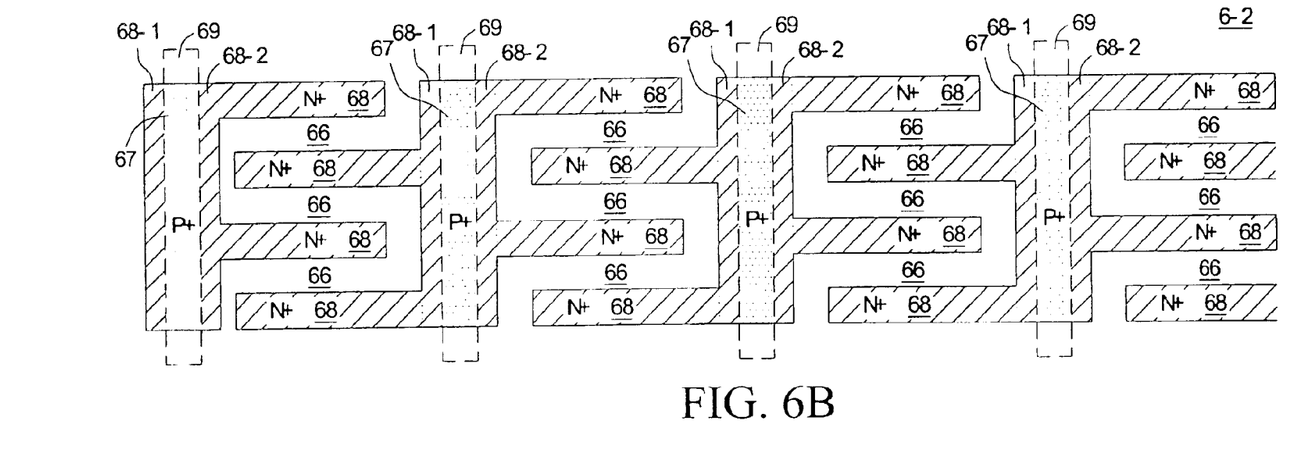
FIG. 6B is the second multi-protruding-portion layout 6-2 of a power MOSFET according to another embodiment of the invention.

FIG. 6B is a multi-protruding-portion layout 6-2 of a power MOSFET. The layout 6-2 is composed of two MOSFET cells of layout 5-2. The periphery length of each source region is increased, and so is the parameter PD. Power MOSFETs of layout 6-2 include a substrate and a plurality of MOSFET cells. Each MOSFET cell includes a base portion of a longitudinal shape and four protruding portions. The base portion is divided into three belt-like zones, which are a first zone, source region 68-1, a second zone, source region 68-2, and a third middle zone, a cell body contact region 67. The protruding portions extend from the sides of the base portion. Further, the power MOSFETs of layout 6-1 include trenched gates 66, the substrate, and an insulation layer isolating the gates 66. The belt-like photo-resist region 69, indicated by the dashed line, covers a larger area than that of the prior art so as to reduce the possibility of photo-resist peel-off.

Figure 7A:
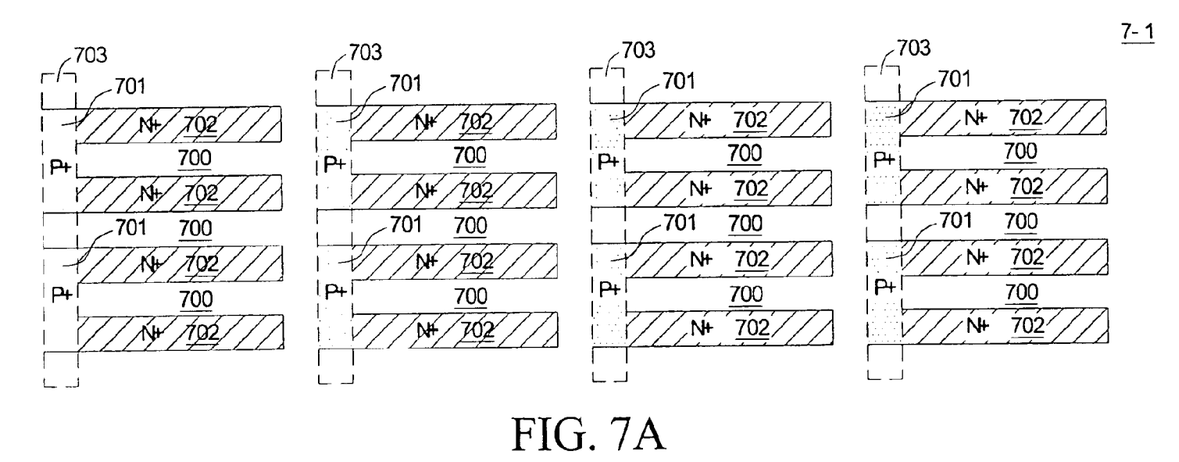
FIG. 7A is a U type layout 7-1 of a power MOSFET according to another embodiment of the invention.

FIG. 7A is a U type layout 7-1 of a power MOSFET. The difference between layout 7-1 and the Z type layout 3-1 is that, for layout 7-1, the protruding portions are on the same side of the base portion. Thus, a plurality of cell body contact regions can connect with each other so as to enlarge the photo-resist covered area to reduce the possibility of photo-resist peel-off. Power MOSFETs of layout 7-1 include a substrate and a plurality of MOSFET cells. Each MOSFET cell includes a base portion of a longitudinal shape, which is a cell body contact region 701, and two protruding portions, which are a source regions 702, extending from the same sides of the base portion. The power MOSFETs of layout 7-1 further include trenched gates 700, an insulation layer isolating the gates 700, and the substrate. The belt-like photo-resist region 703, having a photo-resist profile for forming the source region and the cell body contact region, covers cell body contact region 701 of the same column. The covered area of this photo-resist region is larger than that of the prior art in order to reduce the possibility of photo-resist peel-off.

Figure 7B:
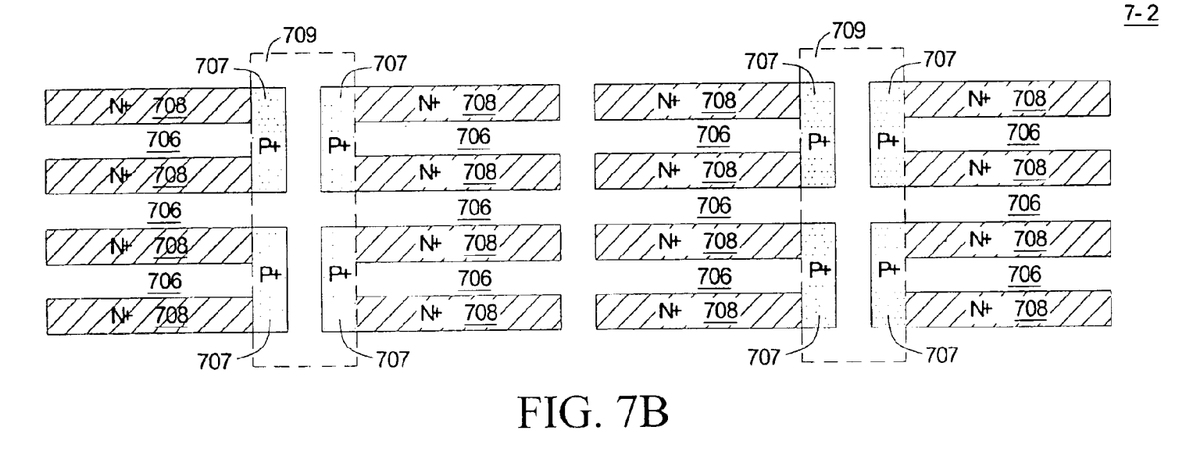
FIG. 7B is the second U type layout 7-2 of a power MOSFET according to another embodiment of the invention.

FIG. 7B is a U type layout 7-2 of a power MOSFET. The difference between layout 7-2 and the layout 7-1 is that, for layout 7-2, two adjacent MOSFETs stay back to back. Power MOSFETs of layout 7-2 include a substrate and a plurality of MOSFET cells. Each MOSFET cell includes a base portion of a longitudinal shape, which is a cell body contact region 707, and two protruding portions, which are a source regions 708, extending from the sides of the base portion. The power MOSFETs of layout 7-2 further include trenched gates 706, an insulation layer isolating the gates 706, and the substrate. The base portions of the adjacent two MOSFET cells of the same row and are grouped into one set. The belt-like photo-resist region 709, having a photo-resist profile for forming the source region and the cell body contact region, covers cell body contact region 707 of the same column. The covered area of this photo-resist region is larger than that of the prior art in order to reduce the possibility of photo-resist peel-off.

Figure 7C:
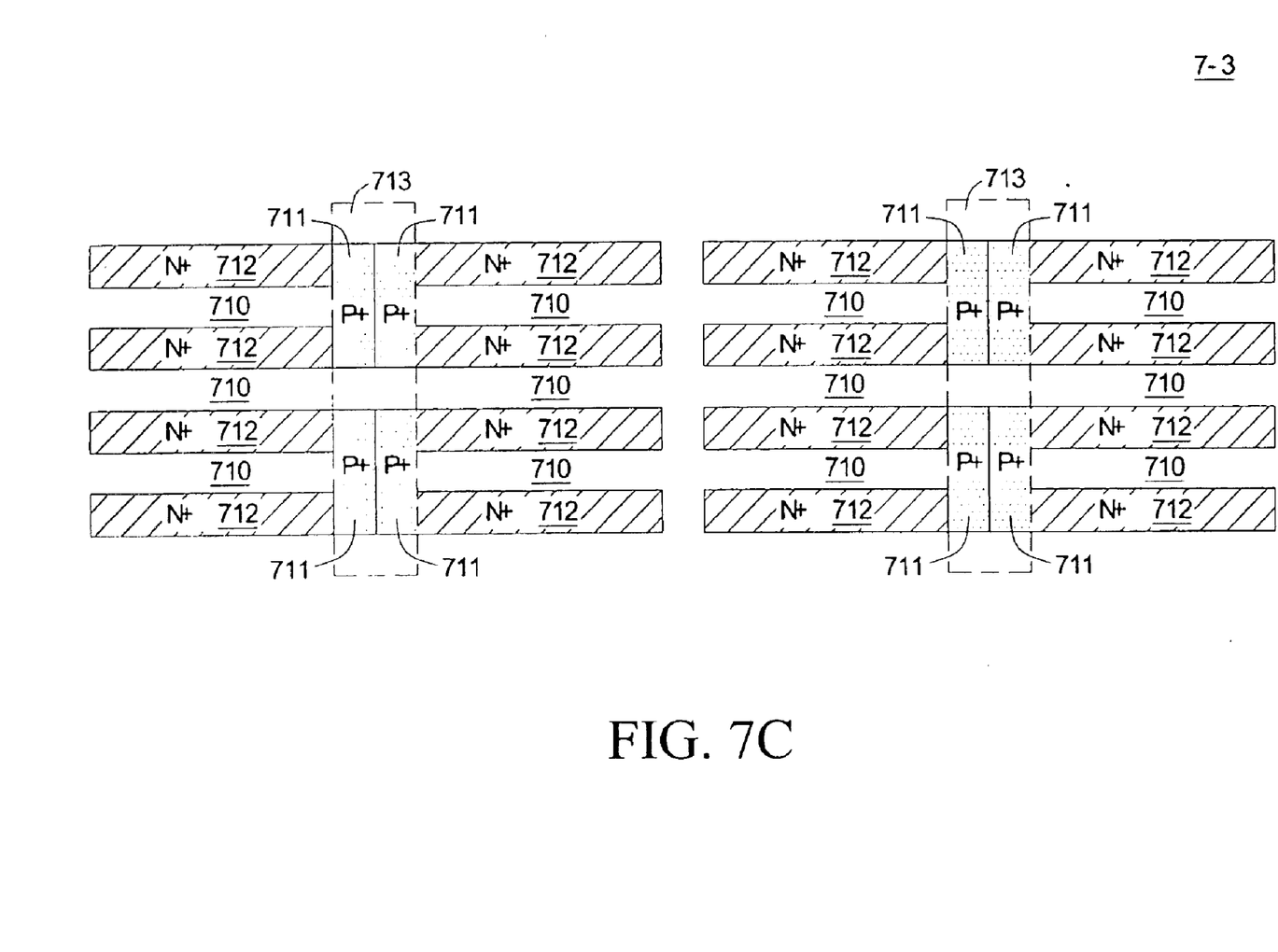
FIG. 7C is the third U type layout 7-3 of a power MOSFET according to another embodiment of the invention.

FIG. 7C is a U type layout 7-3 of a power MOSFET. The difference between layout 7-3 and layout 7-2 is that, for layout 7-3, the base portions of the two adjacent cells are connected together for reducing the cell area. Power MOSFETs include a substrate and a plurality of MOSFET cells. Each MOSFET cell includes a base portion of a longitudinal shape, which is a cell body contact region 711, and two protruding portions, which are a source regions 712, extending from the same sides of the base portion. Further, the power MOSFETs of layout 7-3 include a trenched gates 710, an insulation layer isolating the gates 710, and the substrate. The belt-like photo-resist region 713, having a photo-resist profile for forming the source region and the cell body contact region, covers cell body contact region of the same column. The covered area of this photo-resist region is larger than that of the prior art in order to reduce the possibility of photo-resist peel-off.

Figure 8A:
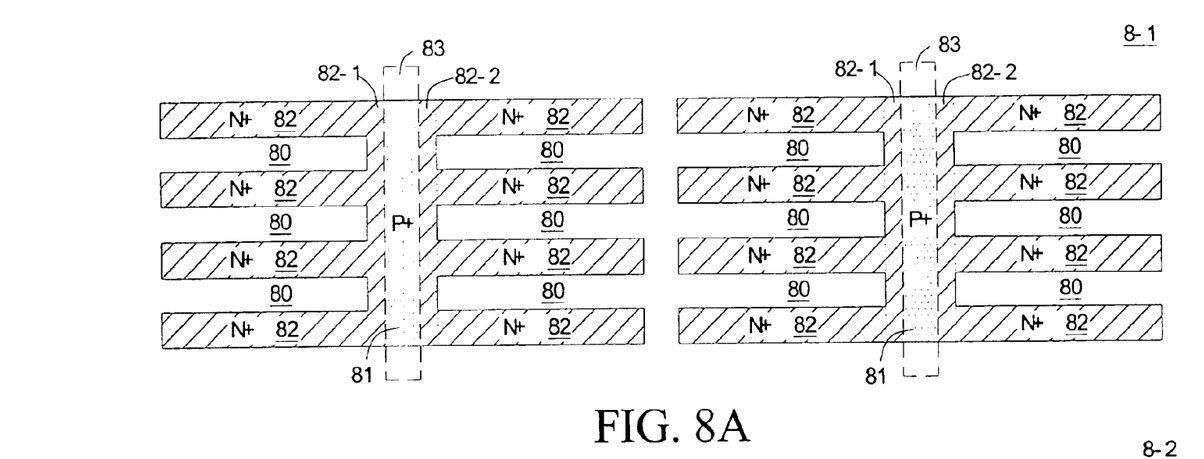
FIG. 8A is a multi-protruding-portion layout 8-1 of a power MOSFET according to another embodiment of the invention.

FIG. 8A is a multi-protruding-portion layout 8-1 of a power MOSFET. Layout 8-1 features a wider base portion so as to increase the periphery length of the source region. Power MOSFETs include a substrate and a plurality of MOSFET cells. Each MOSFET cell includes a base portion of a longitudinal shape and a plurality of protruding portions. The base portion is divided into three zones, the first two zones are source regions 82-1 and 82-2, and the third middle zone is cell body contact region 81. The protruding portions extend from the sides of the base portion and are the source regions 82. Further, the power MOSFETs include trenched gates 80, the substrate and an insulation layer isolating the gates 80. The principal feature of power MOSFET layout 8-1 is that the periphery length of the source region of this transistor is longer, such that the parameter PD=W/D larger, which indicates better properties. The belt-like photo-resist region 83, shown as the dashed lines, covers a plurality of the cell body contact regions 81 of the third middle zone of the same column to cover a larger area than that shown in the prior art so as to reduce the possibility of photo-resist peel-off.

Figure 8B:
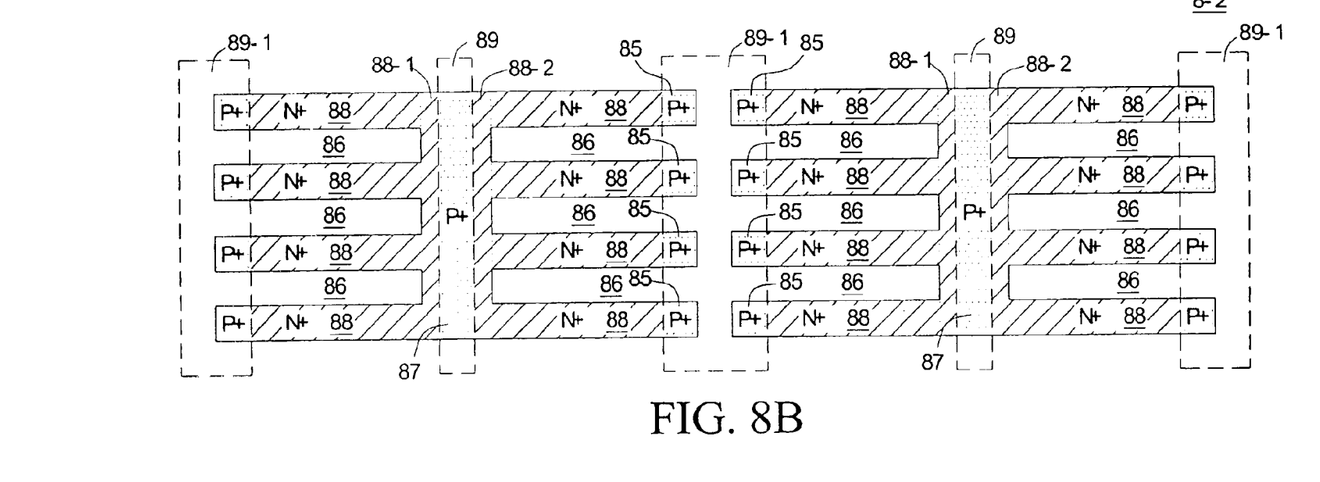
FIG. 8B is the second multi-protruding-portion layout 8-2 of a power MOSFET according to another embodiment of the invention.

FIG. 8B is a multi-protruding-portion layout 8-2 of a power MOSFET. The difference between layout 8-2 and layout 8-1 is that, for layout 8-2, the other end from the joint part of the protruding portion and the base portion includes a cell body contact region 85 for a better ground connection. Power MOSFETs include a substrate and a plurality of MOSFET cells. Each MOSFET cell has a base portion and a plurality of protruding portions. The base portion is divided into three zones, the first two zones are source regions 88-1 and 88-2, and the third middle zone is the cell body contact region 87. The protruding portions extend from the sides of the base portion. The connected part of the protruding portion is the source regions 88 and the end part of the protruding portion is the cell body contact region 85. Further, the power MOSFETs include trenched gates 86, the substrate and an insulation layer isolating the gates 86. The ends of adjacent MOSFET cells of the same row are an end set of every two ends. Each belt-like photo-resist region 89-1, shown as dashed lines, covers the cell body contact region of a plurality of end sets of the same column at the same time. Each photo-resist region 89 covers the cell body contact region in the third zones of the base portions of the same column. Compared to the conventional layout, the covered area of the photo-resist regions 89 and 89-1 is relatively large to reduce the possibility of photo-resist peel-off.

Figure 9A:
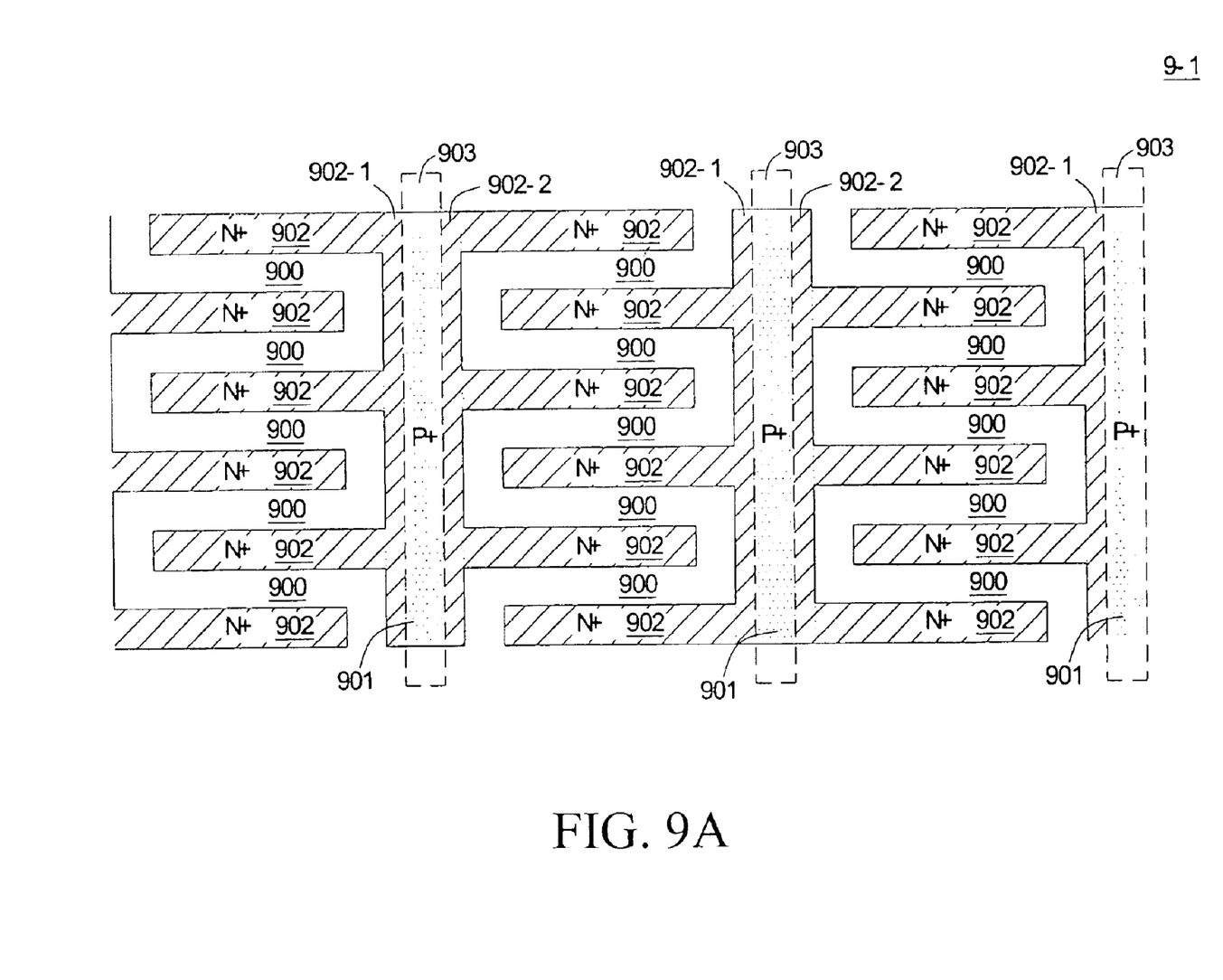
FIG. 9A is an interlaced type layout 9-1 of a power MOSFET according to another embodiment of the invention.

FIG. 9A is an interlaced type layout 9-1 of a power MOSFET. The difference between layout 9-1 and layout 8-1 is that, for layout 9-1, each of the protruding portions of the cells in layout 9-1 extends into the space between the protruding portions of the adjacent cells. Power MOSFETs of layout 9-1 include a substrate and several MOSFET cells. Each MOSFET cell includes a base portion of a longitudinal shape and several protruding portions. The base is divided into three zones. The first zone is source region 902-1, the second zone is source region 902-2, and the third middle zone is cell body contact region 901. The protruding portions, extending from the sides of the base portion, are the source regions 902. Further, the power MOSFETs include trenched gates 900, the substrate, and the insulation layer isolating the gates 900. The belt-like photo-resist region 903, indicated by dashed lines, covers a plurality of the cell body contact regions in the third zones of the base portions of the same column so as to reduce the possibility of photo-resist peel-off.

Figure 9B:
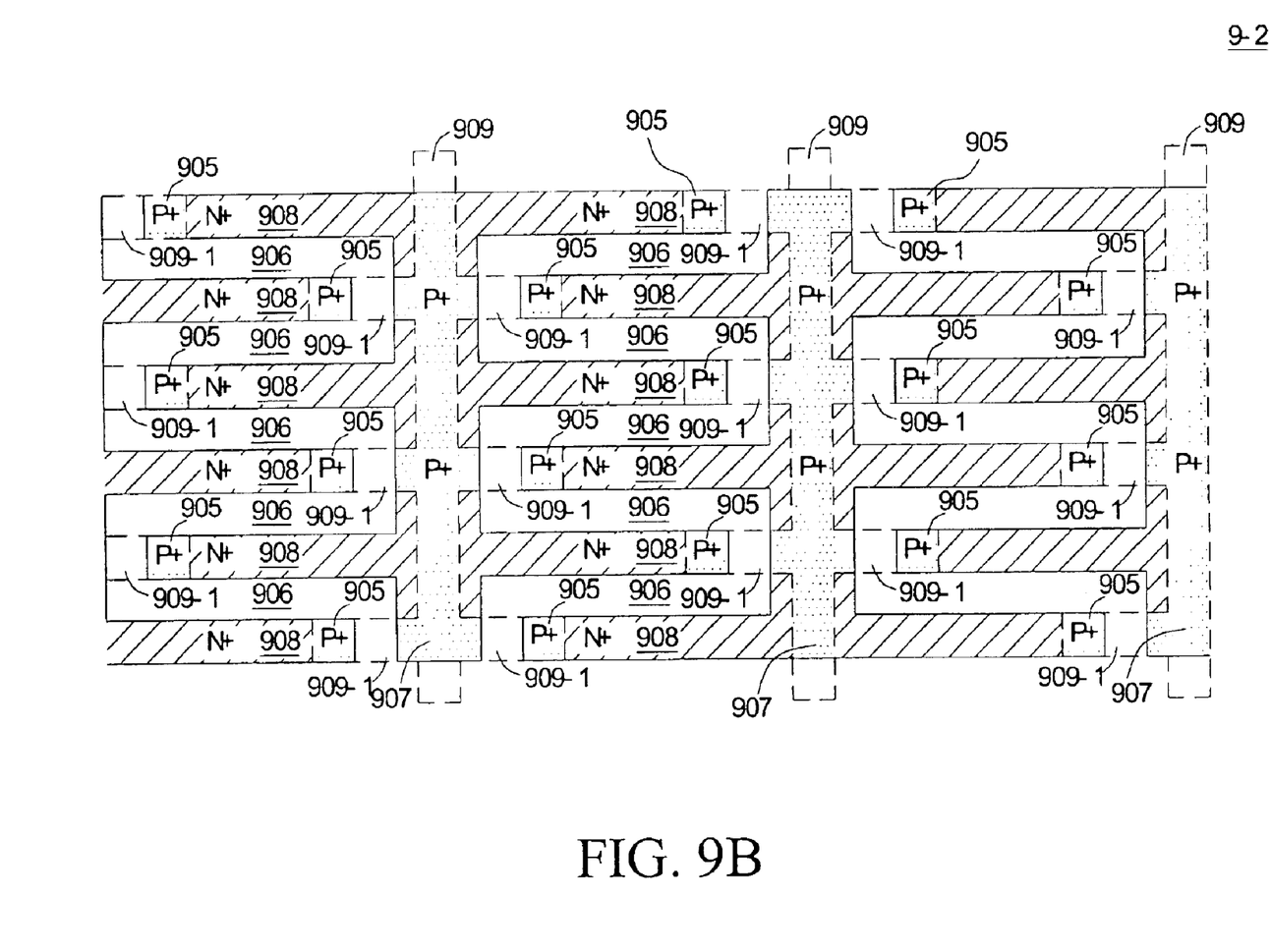
FIG. 9B is the second interlaced type layout 9-2 of a power MOSFET according to another embodiment of the invention.

FIG. 9B is an interlaced type layout 9-2 of a power MOSFET. The difference between layout 9-2 and layout 9-1 is that, for layout 9-2, the other end of the protruding portion, connecting to the base portion, of MOSFETs has a cell body contact region 905 to improve grounding. Power MOSFETs of layout 9-2 includes a substrate and a plurality of MOSFET cells. Each of the MOSFET cells includes a base portion and a plurality of protruding portions. The base portion includes a cell body contact region 907 and a part of a source region 908. The protruding portions extend from the sides of the base portion. One end of the protruding portion, connecting to the base portion, is the source region 908, and the other end is the end part of the protruding portion, that is, the cell body contact region 905. Further, the power MOSFETs include trenched gates 906, the substrate, and the insulation layer isolating the gates 906. Each of the belt-like photo-resist region 909, indicated by dashed lines, includes a plurality of protruding portions 909-1. Each protruding portion extends from the belt-like photo-resist region in the third middle zone to the sides so as to cover the end part of the protruding portion and, therefore, covers a plurality of the cell body contact regions in the third middle zones of the base portions of the same column and protruding portions. The photo-resist region 909 covers a larger area than that in the prior art so as to reduce the possibility of photo-resist peel-off.

Figure 9C:
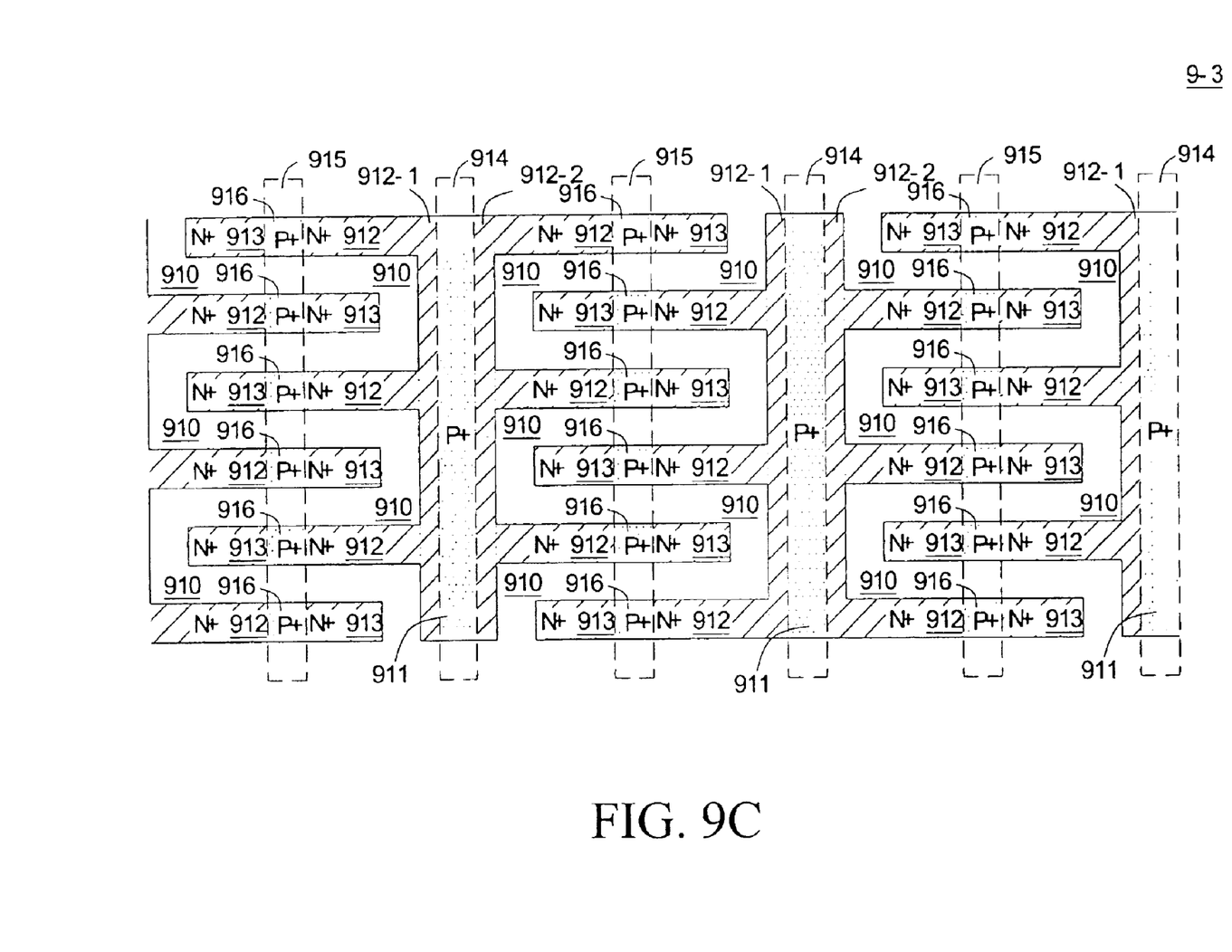
FIG. 9C is the third interlaced type layout 9-3 of a power MOSFET according to another embodiment of the invention.

FIG. 9C is an interlaced type layout 9-3 of a power MOSFET. The difference between layout 9-3 and layout 9-2 is that, for layout 9-3, the cell body contact regions on the protruding portions are located in the middle of each protruding portion. Power MOSFET cells include a substrate and a plurality of MOSFET cells. Each MOSFET cell includes a base portion of a longitudinal shape and a plurality of protruding portions. The base portion is divided into three zones, the first zone is a source region 912-1, the second zone is a source region 912-2, and the third middle zone is cell body contact region 911. The protruding portions extend from the sides of the base portion. One end of the protruding portion, connected with the base portion, is source region 912, the other end of the protruding portion is source region 913, and the middle of the protruding portion between the source region 912 and source region 913 is a cell body contact region 916. Further, the power MOSFETs include trenched gates 910, the substrate, and an insulation layer isolating the gates 910. The belt-like photo-resist region 914, indicated by dashed lines, covers a plurality of cell body contact regions on the third middle zones 911 of the base portions of the same column. The belt-like photo-resist region 915, indicated by dashed lines, covers the cell body region 916, located between the protruding portions, of the same column. The area covered by the belt-like photo-resist region 914 or 915 is so large as to reduce the possibility of photo-resist peel-off.

The above-described arrangements of apparatus and methods are merely illustrative of applications of the principles of this invention and many other embodiments and modifications may be made without departing from the spirit and scope of the invention as defined in the claims. For instance, the sizes and shapes of the various regions of the cells may vary. The scope of the invention should, therefore, be determined not with reference to the above description, but instead should be determined with reference to the appended claims along with their full scope of equivalents.

What is claimed is:

1. A power metal oxide semiconductor field effect transistor (MOSFET) layout comprising:
   a substrate;
   a plurality of cells, each of said cells including:
      a base portion;
      a plurality of protruding portions extending from the base portion, each of said cells being geometrically configured with the base portion and the plurality of protruding portions defining a closed cell boundary enclosing each of said cells; and
      a plurality of photo-resist regions;
   wherein the cells are formed over the substrate, and the closed cell boundaries of the cells are arranged regularly with each other with no overlapping among the cells;
   wherein the base portions are disposed in a matrix arrangement having rows and columns, the base portions being oriented from end to end in a direction of the columns and the protruding portions extending from the base portions along a direction of the rows; wherein the photo-resist regions cover the base portions on the same column; and wherein none of the protruding portions are disposed between the base portions on the same column; and
   wherein the cells are doped with N type dopants by using the photo-resist regions as masks.

2. The power MOSFET layout according to claim 1, wherein the plurality of protruding portions comprise a first protruding portion connected to one end of the base portion and a second protruding portion connected to the other end of the base portion.

3. The power MOSFET layout according to claim 2, wherein the first protruding portion is connected to one side of the base portion and the second protruding portion is connected to the other side of the base portion.

4. The power MOSFET layout according to claim 2, wherein the first protruding portion and the second protruding portion both are connected to the same side of the base portion.

5. The power MOSFET layout according to claim 4, wherein every two base portions on the same row are in a group, none of the protruding portions is disposed between the base portions of the group, and the base portions of the same group on the same column are covered by the same photo-resist region.

6. The power MOSFET layout according to claim 5, wherein the base portions of the same group are connected to each other side by side.

7. The power MOSFET layout according to claim 2, wherein the first protruding portion and the second protruding portion respectively have an end part, the end part of the first protruding portion is at the end opposite to the end by which the first protruding portion connects to the base portion, and the end part of the second protruding portion is at the end opposite to the end by which the second protruding portion connects to the base portion, and each of the photo-resist regions further includes a plurality of branches so as to cover the corresponding end parts, such that each of the photo-resist regions covers the plurality of base portions of the same column as well as the corresponding end parts of the protruding portions.

8. The power MOSFET layout according to claim 7, wherein the end parts are cell body contact regions.

9. The power MOSFET layout according to claim 1, wherein the base portion is divided into a first zone, a second zone, and a third zone, the first zone is located on one side of the base portion, the second zone is located on the other side of the base portion, and the third zone is located between the first zone and the second zone; wherein the plurality of the protruding portions are connected to one of the first zone and the second zone; and wherein the photo-resist region covers a plurality of the third zones of the same column.

10. The power MOSFET layout according to claim 9, wherein the first protruding portion is coupled to the first zone of the base portion and the second protruding portion is coupled to the second zone of the base portion.

11. The power MOSFET layout according to claim 9, wherein the plurality of protruding portions are a first protruding portion, a second protruding portion, a third protruding portion, and a fourth protruding portion, the first protruding portion is coupled to one end of the base portion, the fourth protruding portion is coupled to the other end of the base portion, the second protruding portion and the third protruding portion are substantially aligned with the first protruding portion and the second protruding portion, respectively, in parallel and are coupled to the base portion.

12. The power MOSFET layout according to claim 11, wherein the first protruding portion and the third protruding portion are coupled to one side of the base portion; and wherein the second protruding portion and the fourth protruding portion are coupled to the other side of the base portion.

13. The power MOSFET layout according to claim 9, wherein the protruding portions extend from one side of the base portion and into spaces formed by the protruding portions of the adjacent cells.

14. The power MOSFET layout according to claim 13, wherein a middle part is formed in the middle of each protruding portion, the middle parts of the protruding portions forming groups of middle parts, each group being aligned in a column disposed between adjacent columns of the base portions; and wherein the layout further comprises a plurality of photo-resist regions covering the middle parts, belonging to the same column, of the protruding portions.

15. The power MOSFET layout according to claim 9, wherein an end part is formed at one end of the protruding portion not connecting with the base portion; wherein two of the end parts belonging to the same row are grouped into a pair, the layout further comprises a plurality of second photo-resist regions, each of the second photo-resist regions covering the pairs of end parts of the same column; and wherein none of the protruding portions are disposed between the pairs of end parts of the same column.

16. The power MOSFET layout according to claim 15, wherein the end parts are cell body contact regions.

17. The power MOSFET layout according to claim 15, wherein the protruding portions extend into spaces formed by the protruding portions belonging to the adjacent cells, the photo-resist regions further include a plurality of branches extending out from a side of the photo-resist regions located on the third zone to cover each one of the end parts without covering remaining parts of the protruding portions, so that each photo-resist region covers the cell body contact regions in the third zone belonging to the same column and end parts of the adjacent cells.

18. The power MOSFET layout according to claim 9, wherein the protruding portions comprise a first protruding portion, a second protruding portion, a third protruding portion, a fourth protruding portion, a fifth protruding portion, a sixth protruding portion, a seventh protruding portion, and an eighth protruding portion, wherein the first, the second, the third, and the fourth protruding portions are parallel and respectively coupled the first zone of the base portion, the fifth the sixth, the seventh, and the eighth protruding portions are parallel and respectively coupled with the second zone of the base portion.

19. The power MOSFET layout according to claim 18, wherein the first, the second, the third, the fourth, the fifth, the sixth, the seventh, and the eighth protruding portions respectively have end parts, wherein each two of the end parts of the adjacent cells belonging to the same row are grouped into a pair, none of the protruding portions are disposed between the pairs of end parts of the same column, and further the layout comprises a plurality of second photo-resist region, each of the second photo-resist region covers the pairs of end parts of the same column.

20. The power MOSFET layout according to claim 1, wherein the base portions are cell body contact regions and the protruding portions are source regions.

21. The power MOSFET layout according to claim 1, wherein the power MOSFET is a trenched field effect transistor.

22. The power MOSFET layout according to claim 1, wherein each of the protruding portions of each of the cells is proximally extended into the space separated by the protruding portions of the other adjacent cells.

23. A power metal oxide semiconductor field effect transistor (MOSFET) layout comprising:
a substrate;
a plurality of cells, each of said cells including a base portion and a plurality of protruding portions extending from the base portion;
wherein each of said cells is geometrically configured with the base portion and the plurality of protruding portions defining a closed cell boundary enclosing each of said cells;
wherein the cells are formed over the substrate, and the closed cell boundaries of the cells being geometrically arranged so that one cell does not overlay another cell on the substrate;
wherein the base portions are disposed in a matrix arrangement having rows and columns, the base portions being oriented from end to end in a direction of the columns and the protruding portions extending from the base portions along a direction of the rows; wherein the base portions on the same column are configured to be covered by a photo-resist region; and wherein none of the protruding portions are disposed between the base portions on the same column; and
wherein the cells are processed by using the photo-resist regions as masks.

24. The power MOSFET layout according to claim 23, wherein the plurality of protruding portions comprise a first protruding portion connected to one end of the base portion and a second protruding portion connected to the other end of the base portion.

25. The power MOSFET layout according to claim 23, wherein the base portion is divided into a first zone, a second zone, and a third zone, the first zone is located on one side of the base portion, the second zone is located on the other side of the base portion, and the third zone is located between the first zone and the second zone; wherein the plurality of the protruding portions are connected to one of the first zone and the second zone; and wherein the photo-resist region covers a plurality of the third zones of the same column.

* * * * *